United States Patent [19]

Lezan

[11] 4,404,476
[45] Sep. 13, 1983

[54] PULSE SHAPING AND AMPLIFYING CIRCUIT

[75] Inventor: Georges R. E. Lezan, Roanoke, Va.

[73] Assignee: General Electric Company, Salem, Va.

[21] Appl. No.: 305,091

[22] Filed: Sep. 24, 1981

[51] Int. Cl.³ .................. H03K 5/01; H03K 5/07; H03K 5/12
[52] U.S. Cl. .................. 307/268; 307/246; 307/264; 328/67; 328/65
[58] Field of Search .......... 307/246, 264, 268, 252 L, 307/269; 320/1; 363/67, 68; 328/67, 74, 59, 65, 223

[56] References Cited

U.S. PATENT DOCUMENTS

| | | | |
|---|---|---|---|
| 2,916,640 | 12/1959 | Pearson | 328/67 |
| 3,396,293 | 8/1968 | Harris | 307/268 |
| 4,256,982 | 3/1981 | Bailey | 307/268 |

Primary Examiner—John Zazworsky
Attorney, Agent, or Firm—Arnold E. Renner; Ormand R. Austin

[57] ABSTRACT

A pulse shaping and amplifying circuit receives direct current electrical power from a source and serves to supply a pulse of electrical energy to a load. First and second switches (e.g., transistor switches) are interconnected such that only one is conductive at any one time. The first switch, when conductive serves to connect a capacitor which forms part of an oscillatory circuit, further including an inductor in the form of a transformer primary winding, to the source to place an electrical charge on that capacitor in a first direction. When the second switch is rendered conductive (and the first opened) the load is connected in circuit with the oscillatory circuit and the capacitor discharges to deliver a pulse of electrical power to the load with any excess power being utilized to charge the capacitor in the second direction. A flyback current path including a transformer secondary winding, closely coupled to the primary winding, and a diode is connected in parallel with the capacitor such that the capacitor again changes direction of charge to thus be charged in the direction for supplying the next pulse to the load.

If desired, a second capacitor may be connected in parallel with the oscillatory circuit to improve the rise time of the pulse supplied to the load.

12 Claims, 7 Drawing Figures

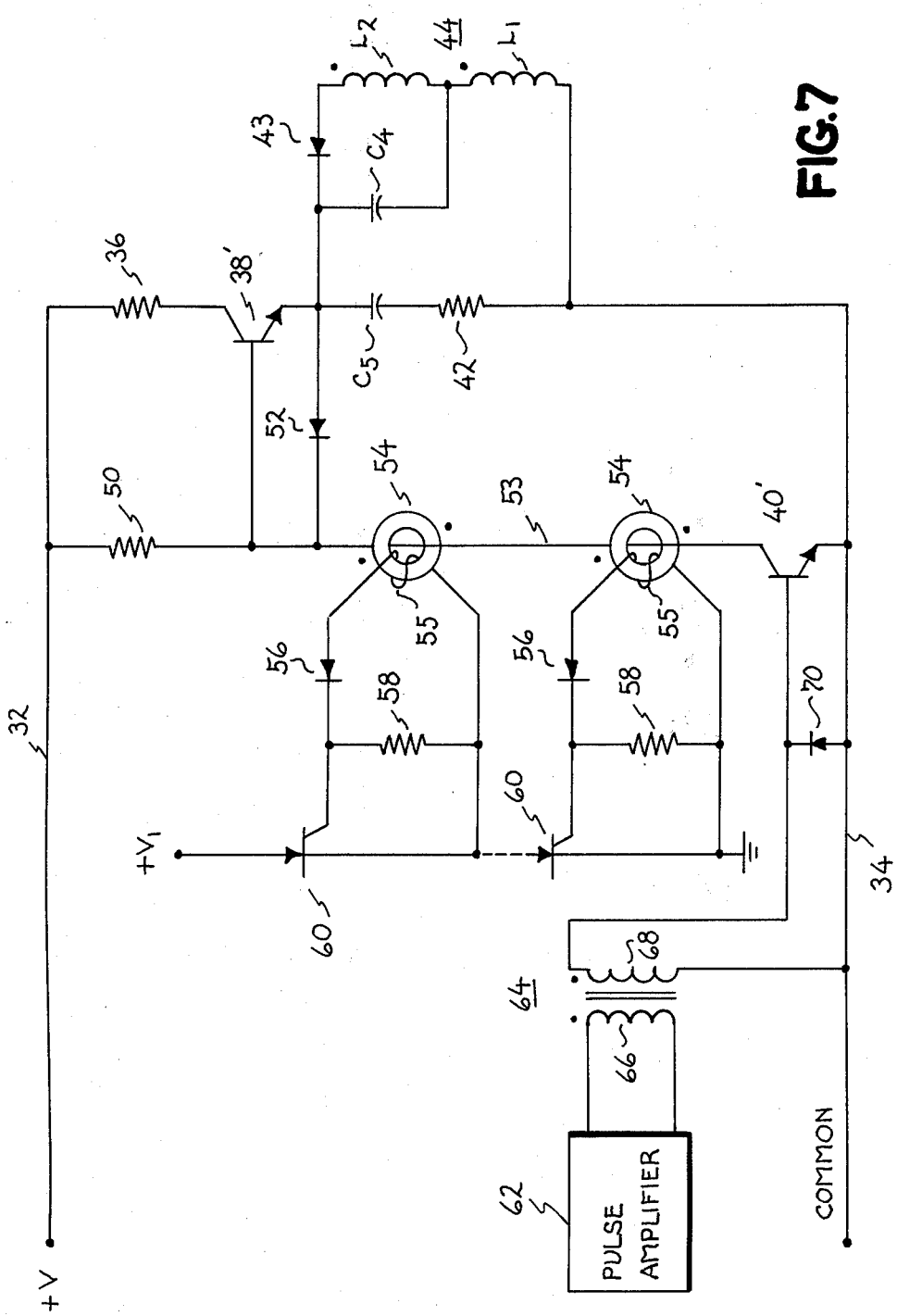

PULSE SHAPING AND AMPLIFYING CIRCUIT

BACKGROUND OF THE INVENTION

The present invention relates generally to pulse shaping and amplifying circuits and more particularly to such a circuit which is highly energy efficient. This invention finds particular application as a gate pulse driver for periodically rendering thyristors conductive.

There are many applications for pulse shaping and amplifying circuits with one very common useage being that of providing gating or triggering signals or pulses which serve to render a thyristor conductive. A thyristor, the most common form of which is the Silicon Controlled Rectifier (SCR), is a three terminal semiconductor device having anode, cathode and gate electrodes which is placed into the connective state by the simultaneous application of a forward bias voltage between the anode and cathode and a gating signal applied to its gate electrode. Once a thyristor achieves conduction, it will normally remain in that condition until there exists a zero or reverse voltage bias between its anode and cathode terminals for a period of time sufficient to permit the current through the thyristor to decrease to substantially zero.

One common type of pulse shaping and amplifying circuit employs a charge storage means, usually in the form of a capacitor, to develop an electrical charge. Once the capacitor has been charged, through suitable switch means, mechanical or electrical, it is permitted to discharge through the load (e.g., a thyristor gate driver) resulting in a pulse of electrical power being delivered to the load. By the proper sizing of circuit component and values, the pulse produced is properly shaped and of a magnitude and duration for the desired function.

In many instances the pulse shape, magnitude and duration requirements dictate that the total electrical power of the pulse far exceeds that normally required by the load. For example, the specified pulse requirements for a thyristor gate driver often far exceed the power required to actually gate the thyristor on; the excess power in the pulse being in the nature of a safety factor to insure thyristor conduction. In these cases, it is apparent that unless this excess power is in some way recovered, the results are wasted energy and the requirement of removing undesirable heat.

SUMMARY OF THE INVENTION

It is, therefore, an object of the present invention to provide an improved pulse shaping and amplifying circuit.

It is a further object to provide a pulse shaping and amplifying circuit having improved efficiency through the recovery of pulse energy in excess of actual load requirements.

It is another object to provide an efficient pulse shaping and amplifying circuit having relatively few components.

Still another object is to provide a relatively simple and low cost pulse shaping and amplifying circuit suitable for use with the gate driver of a thyristor.

The foregoing and other objects are achieved, in accordance with the present invention, by providing in a pulse shaping and amplifying circuit which is adapted to be connected to a source of direct current power, an oscillating circuit including a first inductive means and a charge storage means. Through the use of first switch means, the source is connected to the charge storage means to thereby develop on that means an electrical shape in a first direction. A second switch means, which is interconnected with the first switch means in a manner such that only one of the switch means can be conductive at any one time, is operable to connect the charge storage means in series circuit with the load whereby electrical power in the form of pulse is delivered from the charge storage means to the load to recharge that storage means in a second direction. A flyback path including a second inductive means which is closely magnetically coupled with the first inductive means (e.g., as a closely coupled transformer) is connected in effective parallel with the charge storage means whereby electrical energy not dissipated in said load and the oscillatory circuit is utilized to charge said charge storage means in the first direction.

As an enhancement to the basic circuit described above, a second charge storage means may be connected in parallel with the first in order to provide a faster rise time with respect to the pulse front to thereby enhance the overall operation of the circuit.

BRIEF DESCRIPTION OF THE DRAWING

While the present invention is described in particularity in the claims annexed to and forming a part of this specification, a better understanding of the invention can be had by reference to the following description taken in conjunction with the accompanying drawing in which:

DETAILED DESCRIPTION

Figure 1:
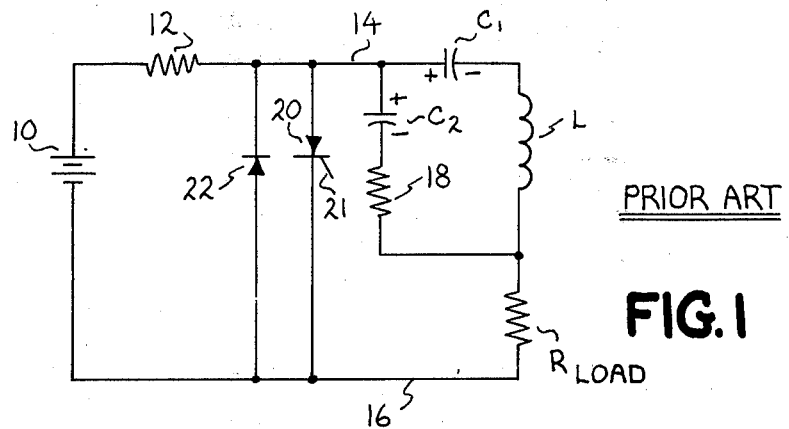
FIG. 1 is a basic schematic drawing showing a typical prior art pulse shaping and amplifying circuit, the understanding of which will assist in the comprehension of the present invention.

Reference is first made to FIG. 1 which shows a typical pulse shaping and amplifying circuit in accordance with the prior art. As shown in that figure, a suitable source 10 of direct current (dc) is connected by way of a current limiting resistor 12 and a bus 14 to one plate of a charge storage means shown as a capacitor $C_1$. The other plate of capacitor $C_1$ is connected to an inductive means (inductor L). To complete the circuit, the other side of the inductor L is connected by way of a load ($R_{load}$) and bus 16 to the negative terminal of the dc source 10. A series arrangement of a capacitor $C_2$ and a resistor 18 is connected in parallel with the series arrangement of capacitor $C_1$ and the inductor L. A suitable switching means shown here as a thyristor 20, having a gate electrode 21, is connected between the buses 14 and 16 in a direction to conduct current from bus 14 to bus 16 when appropriately gated. A diode 22 is connected between the buses 14 and 16 in an anti-parallel relationship to the thyristor 20.

The operation of the circuitry of FIG. 1 is substantially as follows. Electrical current flows from a positive terminal of battery 10 through resistor 12 and via bus 14, capacitor $C_1$, inductor L, the load ($R_{load}$) and bus 16 to the negative terminal battery to thus charge the left-hand plate of the capacitor $C_1$ positive as is indicated in that figure. A second current path exists from bus 14 through the capacitor $C_2$ and resistor 18 to also charge that capacitor in the direction indicated. When it is desired to apply a positive pulse to the load ($R_{load}$), thyristor 20 is gated on through some suitable means (not shown) by the application of a gate signal to its gate electrode 21 such that a current circulation path exists from indicated positive plates of capacitors $C_1$ and $C_2$ via bus 14, thyristor 20, to the load $R_{load}$ and hence either by inductor L or resistor 18 to the lower plates of the respective capacitors. Assuming that the total amount of energy is not absorbed by the load and the circuit components, capacitors $C_1$ and $C_2$ will now become charged in a direction opposite to that shown. If this voltage charge is of sufficient value, there will then be a ringing current flowing in the opposite direction through the load by way of diode 22 to thus, in effect, recharge the capacitors $C_1$ and $C_2$ positive in the indicated direction once again.

Figure 2:
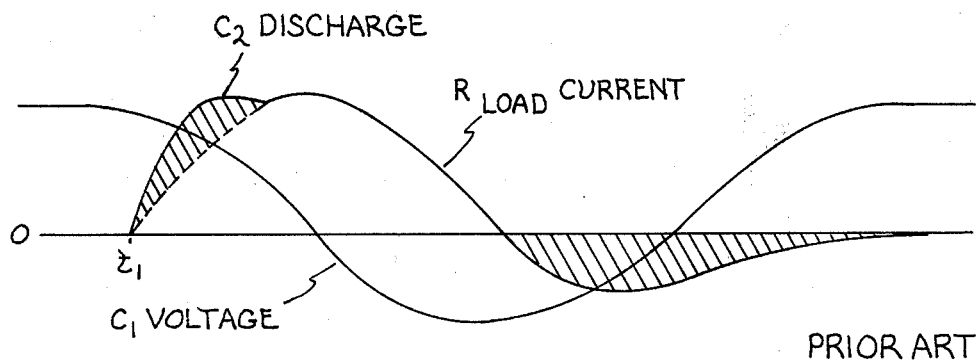
FIG. 2 shows electrical waveforms helpful in the understanding of the operation of the circuit of FIG. 1.

In circuits of this nature, capacitor $C_1$ will normally be large (e.g., five times the value) as compared to capacitor $C_2$ such that capacitor $C_1$ serves as the main charge storage means with the capacitor $C_2$ serving in a secondary capacity to provide a faster rise time for the pulse which is supplied to the load. This is more clearly demonstrated in FIG. 2 which shows, on the same time axis, both the $R_{load}$ current and the $C_1$ voltage. As seen in FIG. 2, prior to time $t_1$ the $C_1$ voltage is constant at some level which will be, for example, the positive voltage of the battery 10. At time $t_1$ thyristor 20 is rendered conductive and it is seen that the $C_1$ voltage falls to a negative value and, in accordance with the earlier discussion, will then rise again to the constant positive value.

The load current is represented by the other line in FIG. 2. As indicated by the dotted line near time $t_1$, without capacitor $C_2$ the load current would follow a generally slowly rising path, then reverse, going negative, and then again reverse direction to approach zero volts. The faster rise time depicted by the solid center line in FIG. 2 beginning at time $t_1$ is due to the discharge of the smaller auxiliary capacitor $C_2$. The shaded portion which exists to the right in FIG. 2 and which is below zero line represents the ampere seconds which are available in this kind of a system to be returned to recharge the capacitors $C_1$ and $C_2$ in the original direction. These ampere seconds are, however, returned through $R_{load}$ and thus there is a potential for a fairly large amount of wasted energy in this type of system.

This prior art system also suffers from another defect when the, as here illustrated, switching means 20 is a thyristor. The circuit component values become very critical because if the load absorbs essentially all of the available energy, thyristor 20 may latch into the conducting state by virtue of its application to the power supply. A further defect in this type of system is that the pulse repetition rate; i.e., the rate at which the thyristor 20 (the switching means) can be repetitively operated, is determined by the natural frequency of the oscillatory circuit, primarily the circuit comprised of elements $C_1$ and L. This is illustrated in FIG. 2 by the trailing edge of the load current which controls the natural oscillation. This trailing is unnecessarily long contributing to additional energy losses at the end of the pulse.

Figure 3:
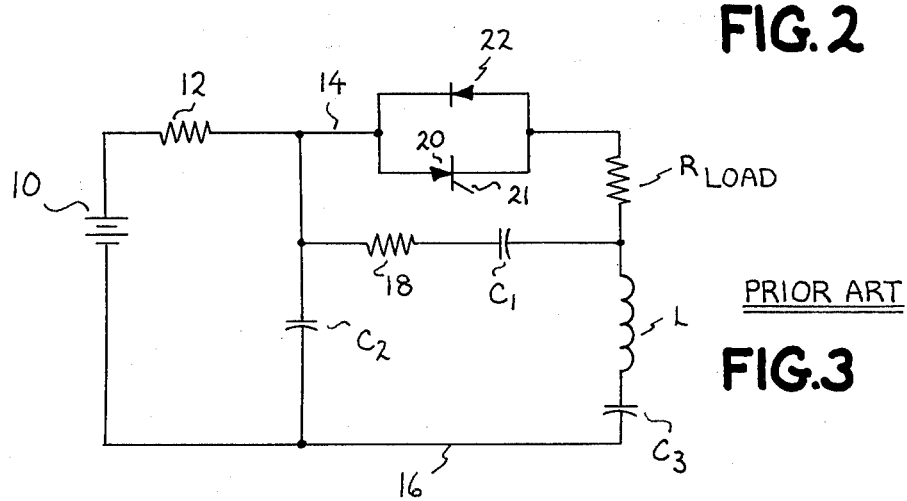
FIG. 3 is a basic schematic diagram of a modification of the circuit shown in FIG. 1 in accordance with the prior art.

FIG. 3 illustrates one known, prior art method of correcting some of the problems with the FIG. 1 depiction. In FIG. 3, like components had been provided with the same designation as with respect to FIG. 1. While there has been some minor rearrangement of circuit elements, the major difference between the circuits of FIGS. 1 and 3 is the addition of a third capacitor $C_3$. The addition of this capacitor will prevent the problem of the thyristor latching into the conducting state by virtue of the elimination of any dc current path which can be followed by the thyristor current. However, in other respects this circuit suffers from, basically, the same defects as with respect to the FIG. 1 depiction.

Figure 4:
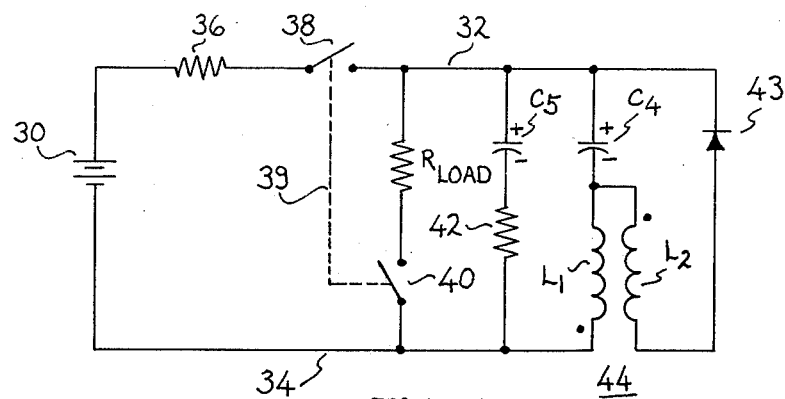
FIG. 4 is a schematic diagram showing the present invention in its basic form.

Reference is now made to FIG. 4 which shows the present invention in its basic form. As there shown, a source of dc power illustrated as a battery 30 has its positive terminal connected by way of resistor 36, a first switching means 38 and bus 32 to the upper plate of a charge storage means illustrated as a capacitor $C_4$. The other plate of capacitor $C_4$ is connected to a first inductive means $L_1$, shown as the primary winding of a transformer 44. The other end of the inductive means $L_1$ is connected by way of bus 34 back to the negative terminal of the battery 30. In this case the load, $R_{Load}$, is connected in series circuit with a second switching means 40 between the two buses 32 and 34. As indicated by dashed line 39, the two switching means 38 and 40 are interconnected such that only one can be in the conductive position at any one time. The switching means 38 and 40 may, of course, be of any suitable type such as mechanical switches but more practically, as will be more fully understood and as shown in FIG. 7 to be described, some electronic switching means such as transistor switching circuits are used. In a manner similar to that described with respect to the prior art, a series circuit including a second charge storage means (capacitor $C_5$) and a resistor 42 is connected in parallel with the oscillatory circuit comprising capacitor $C_4$ and inductive means $L_1$. A flyback current circuit is connected in parallel with the capacitor $C_4$. This flyback circuit is comprised of a second inductive means $L_2$ shown as the secondary winding of transformer 44 and a diode 43 polled to conduct current to the upper plate of capacitor $C_4$. Transformer 44 is preferably an air core transformer in which the primary and secondbary windings are very closely magnetically coupled, as by bifilar winding on a single core, such that there is little mutual inductance therebetween.

Figure 5:
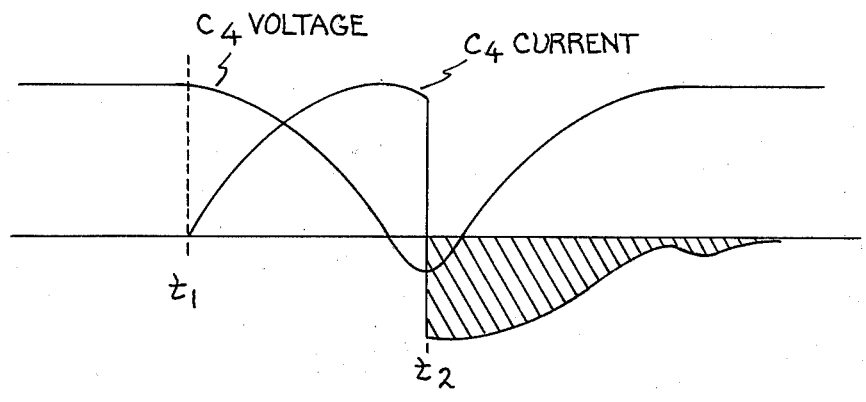
FIGS. 5 and 6 are electrical waveforms useful in the understanding of the operation of FIG. 4; and, FIG. 7 is a schematic diagram showing the present invention in its preferred embodiment and connected to supply the gate drive circuits of series connected thyristors.
Figure 6:
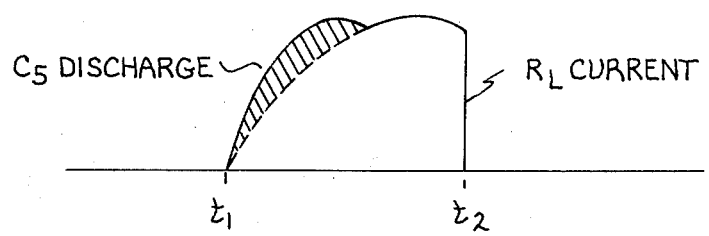

The operation of the circuit of FIG. 4 is best understood when viewed in conjunction with the waveforms of FIGS. 5 and 6. When switching means 38 conducts, capacitors $C_4$ and $C_5$ will charge positively at their upper plates to a value approximately equal to the value of the power supply or battery 30. This is shown in FIG. 5 by the waveform designated "$C_4$ voltage" prior to time $t_1$. When it is desired to provide a pulse of electrical power to the load, switch 40 is closed (opening switch 38) and capacitor $C_4$ then discharges from its upper plate by way of bus 32 through the load ($R_{Load}$), the switch 40, bus 34 and inductive means $L_1$. In FIG. 5, the closing of switch 40 corresponds to time $t_1$. As the $C_4$ voltage begins to fall, the current through that capacitor, which will be from bottom to top, will begin to rise and that current passing through the first inductive means $L_1$ will bias diode 43 into the non-conductive state. This current in the oscillatory circuit comprising $L_1$ and $C_4$ (shown in FIG. 5 as "$C_4$ current") will tend charge capacitor $C_4$ in the opposite direction from that indicated in FIG. 4. As soon as capacitor $C_4$ begins to charge in the opposite direction, the current will begin to decay. At this time, time $t_2$ in FIGS. 5 and 6, switch 40 is opened (switch 38 is closed) and the inductive means $L_1$ will reverse its polarity in an effort to maintain current such that its polarity will be in the direction opposite to the dots shown in FIG. 4. This polarity reversal of $L_1$ (and, hence of $L_2$) will bias diode 43 into the conductive condition and the current through the oscillatory circuit, $C_4$ current, will therefore immediately reverse direction, as indicated at time $t_2$ in FIG. 5 to assist the charging of the capacitor $C_4$ in its original direction, that is, positive at its upper plate. This current reversal occurs substantially instantaneously and with this reversal, as shown by the shaded area with respect to the $C_4$ current waveform beginning at time $t_2$, there is a substantial amount of ampere seconds available to assist in the recharging of capacitor $C_4$ and thus conserve the energy.

Because of the nature of the flyback arrangement, it is seen that, to the right of time $t_2$, the load current approaches a zero value in a much shorter time than was prevalent in the prior art and thus repetition cycle of the circuit may be increased.

FIG. 6 depicts the load current. The shaded area at the left beginning at time $t_1$ is due to the discharge of the auxillary charge storage means $C_5$, in a manner substantially identical to that described with respect to the art, to provide a very steep wave front. As illustrated in FIG. 6 the time between $t_1$ and $t_2$ is the pulse which is available as the load current.

FIG. 7 illustrates the present invention in its preferred embodiment employing transistor switches and as applied to supplying pulses to the gate driver circuits of a plurality of series connected thyristors. It is apparent that FIG. 7 is a substantial duplication of FIG. 4 (with the exceptions noted) with the addition of such elements as are required to operate the transistor switches. As such, like characters used to designate elements in FIG. 4 will, insofar as practical, be utilized in FIG. 7. Referencing now FIG. 7, the dc power supply is in this case represented by a $+V$ voltage being applied to bus 32 and bus 34 being connected to common. In the operation of this circuit, in the quiescent state, switch 40' (a transistor) is in the non-conductive state and switch 38' (also a transistor) is in the conductive state. The $+V$ voltage is, therefore, connected by way of bus 32 and resistor 36 to the collector of transistor 38' the emitter of which is connected to the upper plate of the main charge storage means (capacitor $C_4$). With transistor 40' being non-conductive, transistor 38' is held in the conductive state by virtue of its connection to bus 32 by way of a resistor 50. Thus, with transistor 38' conducting, current will flow from the positive terminal $+V$ via bus 32 and resistor 36 to charge capacitors $C_4$ and $C_5$ in a manner described with respect to FIG. 4. A diode 52 is connected between the junction of the upper plate of capacitor $C_4$ with the emitter of transistor 38' and a line 53. Line 53 forms a single turn primary winding of a plurality of transformers each having a toroidal core 54 and a secondary winding 55. Each secondary winding 55 is connected, in the polarity indicated by the dots, by way of a diode 56 to the gate terminal of a thyristor 60. The several thyristors are connected in series between a source of positive voltage $+V_1$ and ground. A resistor 58 is connected between the gate electrode and anode of each thyristor. This circuit is one which is well known in the art for the gating or triggering of thyristors.

When a suitable current exists in line 53, the thyristors 60 will be gated into a conductive condition assuming, of course, that the voltage $+V_1$ is of sufficient value to achieve this function. It should be noted that while only two thyristors 60 are shown, it is common the art to provide a larger number (e.g., six) of such series connected thyristors.

The existence of a current in line 53 is achieved by rendering transistor 40' conductive. This is illustrated in FIG. 7 by the use of a suitable pulse amplifier which may be any of those well known in the art which supplies, when conduction is desired, an electrical pulse to a primary winding 66 of a transformer 64. This pulse, by design of the amplifier 62, is of a duration corresponding to the period between times $t_1$ and $t_2$ (FIGS. 5 and 6) which is a period which can be calculated in accordance with the electrical component values to be employed in the particular circuit used. Transformer 64 has a secondary winding 68 which will, when a positive pulse is applied to primary 66, provide a positive bias to the base of transistor 40' which is normally in a non-conductive condition by virtue its base to emitter connection through transformer secondary 68. When transistor 40' is rendered conductive through the application of this positive bias, the base of transistor 38' will be pulled to the common voltage of bus 34 thus rendering that transistor non-conductive. The charges existing on the capacitors $C_4$ and $C_5$ will deliver a current, via diode 52, line 53, and the collector to the emitter of transistor 40' to the oscillatory circuit including inductor $L_1$ and capacitor $C_4$. The reversal of the current to recharge capacitor $C_4$ positive at the top plate is the same as described with respect to FIG. 4 and the rest of the operation of the circuit is as described with respect to that figure. In this situation when the $C_4$ current (FIG. 5) begins decreasing, corresponding to the time of termination of the pulse from amplifier 62, transistor 40' will cease conduction thus placing transistor 38' back into the conductive condition and once again capacitor $C_4$ (and capacitor $C_5$) will receive a positive charging current from the source $+V$. Diode 70 is included to provide a bypass path for transformer 64 to thus protect transistor 40'.

Thus it is seen this circuit is a relatively inexpensive and highly efficient shaping and amplifying circuit which, by virtue of its flyback path, serves to conserve energy which is not dissipated within the load.

While there has been shown and described what is at present considered to be the preferred embodiment of the invention, modifications thereto will readily occur to those skilled in the art. It is not desired, therefore, that the invention be limited to the specific circuit shown and described and it is intended to cover in the appended claims and all such modifications as fall within the true spirit and scope of the invention.

What is claimed is:

1. A pulse shaping and amplifying circuit, adapted to be connected to a source of direct current power, for selectively supplying a pulse of electrical power to a load comprising:
   (a) an oscillatory circuit including first inductive means and a charge storage means;
   (b) first switch means operable to connect the source to said charge storage means to thereby develop an electrical charge on said charge storage means in a first direction;

(c) second switch means operable to connect said charge storage means in series circuit with the load whereby electrical power is delivered from said charge storage means to the load and said charge storage means is charged in a second direction; and, (d) a flyback path including a second inductive means closely magnetically coupled with said first inductive means, said flyback path connected in effective parallel with said charge storage means whereby electrical energy not dissipated in said load and said oscillatory circuit is utilized to charge said charge storage means in the first direction.

2. The invention in accordance with claim 1 wherein said first and second switch means comprise, respectively, first and second transistors.

3. The invention in accordance with claim 1 wherein said first and second inductive means comprise a closely coupled air core transformer.

4. The invention in accordance with claim 1 wherein said charge storage means comprises a capacitor.

5. A pulse shaping and amplifying circuit, adapted to being connected to a source of direct current power, for selectively supplying pulses of electrical power to a load comprising:

(a) a series connected oscillatory circuit including a first charge storage means and an inductive means;

(b) first switch means operable to connect the source to said oscillatory circuit whereby said first charge storage means develops and stores an electrical charge in a first direction;

(c) second switch means operable to connect the load in series circuit with said oscillatory circuit whereby upon the operation of said second switch means a pulse of electrical power is delivered to said load by the discharge of said electrical charge on said first charge storage means and whereby said first storage means develops a charge in a second direction;

(d) means to interconnect said first and second switch means whereby only one switch means is electrically conductive at any one time; and, (e) a flyback current path including a second inductive means connected in effective parallel with said oscillatory circuit, said second inductive means being closely magnetically coupled with said first inductive means, said flyback current path serving to deliver current from said first charge storage means charged in the second direction back to said first charge storage means to thereby recharge said first charge storage means in said first direction.

6. The invention in accordance with claim 5 further including a second charge storage means connected in effective parallel with the first charge storage means whereby the rise time of the pulse supplied to the load is enhanced.

7. The invention in accordance with claim 5 wherein said first and second switch means comprise respectively first and second transistors.

8. The invention in accordance with claim 5 wherein said first and second inductive means comprise a closely coupled air core transformer.

9. The invention in accordance with claim 7 further including means for furnishing an electrical pulse to said second transistor to thereby render it conductive.

10. The invention in accordance with claim 5 wherein said charge storage means comprises a capacitor.

11. The invention in accordance with claim 5 wherein said flyback current path further includes a diode connected in series with said second inductive means.

12. In combination:

(a) a source of direct current power;

(b) an oscillatory circuit including a capacitor and a transformer primary winding;

(c) a first transistor switch for connecting said source to said oscillatory circuit, said first transistor switch being normally conductive by virtue of its connection to said source and serving to deliver electrical current from the source to charge said capacitor in a first direction;

(d) a second transistor switch adapted to be rendered conductive in response to an externally applied signal;

(e) means interconnecting said first and second transistor switches whereby the rendering of said second transistor switch conductive renders said first transistor switch non-conductive;

(f) means interconnecting said second transistor switch, said oscillatory circuit and an electrical load whereby upon the conduction of said second transistor switch the charge on the capacitor serves to supply a pulse of electrical power to the load and to charge said capacitor in a second direction; and, (g) flyback circuit means, including a transformer secondary winding magnetically closely coupled to said primary winding and a diode, for reversing the charge on said capacitor from the second direction to the first.

* * * * *